United States Patent
Morishita et al.

(10) Patent No.: US 10,291,222 B2
(45) Date of Patent: May 14, 2019

(54) GATE POTENTIAL CONTROL DEVICE

(71) Applicant: TOYOTA JIDOSHA KABUSHIKI KAISHA, Toyota-shi, Aichi (JP)

(72) Inventors: Hidetoshi Morishita, Takahama (JP); Hikaru Watanabe, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/903,242

(22) Filed: Feb. 23, 2018

(65) Prior Publication Data

US 2018/0269870 A1 Sep. 20, 2018

(30) Foreign Application Priority Data

Mar. 15, 2017 (JP) ................................ 2017-050140

(51) Int. Cl.
*H03K 17/687* (2006.01)
*H03K 17/16* (2006.01)
*H03K 17/0812* (2006.01)

(52) U.S. Cl.
CPC ..... *H03K 17/162* (2013.01); *H03K 17/08122* (2013.01); *H03K 17/163* (2013.01); *H03K 17/687* (2013.01); *H03K 17/166* (2013.01)

(58) Field of Classification Search
CPC ........... H03K 17/567; H03K 17/04123; H03K 17/04126; H03K 17/725; H03K 17/063; H03K 17/162; H03K 17/08122; H03K 17/687

See application file for complete search history.

(56) References Cited

U.S. PATENT DOCUMENTS 8,203,377 B2 * 6/2012 Kelley ............. H03K 17/04123
326/21
2017/0040992 A1 * 2/2017 Nakano ............ H03K 17/08122
2017/0099046 A1 4/2017 Osanai et al.

FOREIGN PATENT DOCUMENTS

JP 2009-273071 A 11/2009
JP 2017-070164 A 4/2017

* cited by examiner

*Primary Examiner* — Long Nguyen
(74) *Attorney, Agent, or Firm* — Sughrue Mion, PLLC

(57) ABSTRACT

A gate potential control device configured to control potential of a gate of a main switching element is provided herein. The gate potential control device includes: a turn-on switching element and a turn-off switching element. In a turn-off operation, a main voltage between main terminals of the main switching element increases from an on-voltage to a peak value of a surge voltage and then decreases to an off-voltage. The gate potential control device is configured to keep both of the turn-on switching element and the turn-off switching element turned off in a period which is at least a part of a specific period in the turn-off operation, the specific period being from a timing after a predetermined time lapse from a timing of rise-up of the main voltage from the on-voltage to a timing at which the main voltage reaches the peak value.

5 Claims, 3 Drawing Sheets

GATE POTENTIAL CONTROL DEVICE

TECHNICAL FIELD

The technology disclosed herein relates to a gate potential control device.

BACKGROUND

In a turn-off operation in which a switching element is turned off, a voltage between main electrodes of the switching element may instantaneously increase. The voltage which is instantaneously increased in this way is called as a surge voltage.

Japanese Patent Application Publication No. 2009-273071 describes a gate potential control device capable of reducing the surge voltage when the switching element is turned off. The gate potential control device controls a potential of a gate of the switching element. Note that, in the following, the switching element to be controlled by the gate potential control device may be abbreviated as a main switching element. In the gate potential control device described in Japanese Patent Application Publication No. 2009-273071, in a turn-off operation in which the main switching element is turned off, a total resistance of gate-off resistors (resistors connected between a gate and an of and configured to discharge the gate) can be changed. The total resistance of the gate-off resistors is reduced in an initial stage of the turn-off operation, and the total resistance of the gate-off resistors is increased in a late stage of the turn-off operation. Thus, in the late stage of the turn-off operation (that is, during a period in which the surge voltage is generated), an increasing rate of the voltage between the main electrodes of the main switching element becomes low, and hence the surge voltage can be reduced.

SUMMARY

The gate potential control device described Japanese Patent Application Publication No. 2009-273071 need to include the plurality of resistors to be used as the gate-off resistors which have different resistances, and switching elements (control switching elements) configured to switch the resistors which are used in a turn-off current path. As a result, the gate potential control device is increased in size. In view of such circumstances, according to an embodiment of the present disclosure, there is provided a gate potential control device which is downsized while being capable of reducing a surge voltage.

A gate potential control device configured to control potential of a gate of a main switching element is provided. The gate potential control device may comprise: a turn-on switching element including main terminals one of which is connected to a gate-on potential and the other of which is connected to the gate; and a turn-off switching element including main terminals one of which is connected to the gate and the other of which is connected to a gate-off potential which is lower than the gate-on potential. In a turn-off operation in which the main switching element is turned off by discharging the gate through the turn-off switching element, a main voltage between main terminals of the main switching element may increase from an on-voltage to a peak value of a surge voltage and then decrease to an off-voltage which is lower than the peak value and higher than the on-voltage. The gate potential control device may be configured to keep both of the tarn-on switching element and the turn-off switching element off in a period which is at least a part of a specific period in the turn-off operation. The specific period may be from a timing after a predetermined time lapse from a timing of rise-up of the main voltage from the on-voltage to a timing at which the main voltage reaches the peak value.

Note that, the one of the main terminals of the turn-on switching element may be connected directly to the gate-on potential, or may be connected to the gate-on potential through another element such as a resistor. Further, the other of the main terminals of the turn-on switching element may be connected directly to the gate of the main switching element, or may be connected to the gate of the main switching element through another element such as a resistor. Still further, the one of the main terminals of the turn-off switching element may be connected directly to the gate of the main switching element, or may be connected to the gate of the main switching element through another element such as a resistor. Yet further, the other of the main terminals of the turn-off switching element may be connected directly to the gate-off potential, or may be connected to the gate-off potential through another element such as a resistor.

In the gate potential control device, the period in which both of the turn-on switching element and the turn-off switching element are kept turned off is set prior to the occurrence of the peak value of the surge voltage. Thus, before the main voltage reaches the peak value, both of the turn-on switching element and the turn-off switching element are turned off. Then, the potential of the gate of the main switching element floats, and the potential of the gate is increased by capacitive coupling between the main electrode on the high-potential side and the gate of the main switching element. Due to this, impedance of the main switching element becomes relatively low, and an increasing rate of the main voltage becomes low. As a result, the peak value of the surge voltage which is generated thereafter decreases. In other words, the surge voltage is reduced. Further, the gate potential control device reduces the surge voltage by turning off both of the torn-on switching element and the turn-off switching element, and hence a plurality of gate-off resistors for reducing the surge voltage need not be used. Consequently, the gate potential control device can be downsized.

DETAILED DESCRIPTION

Figure 1:
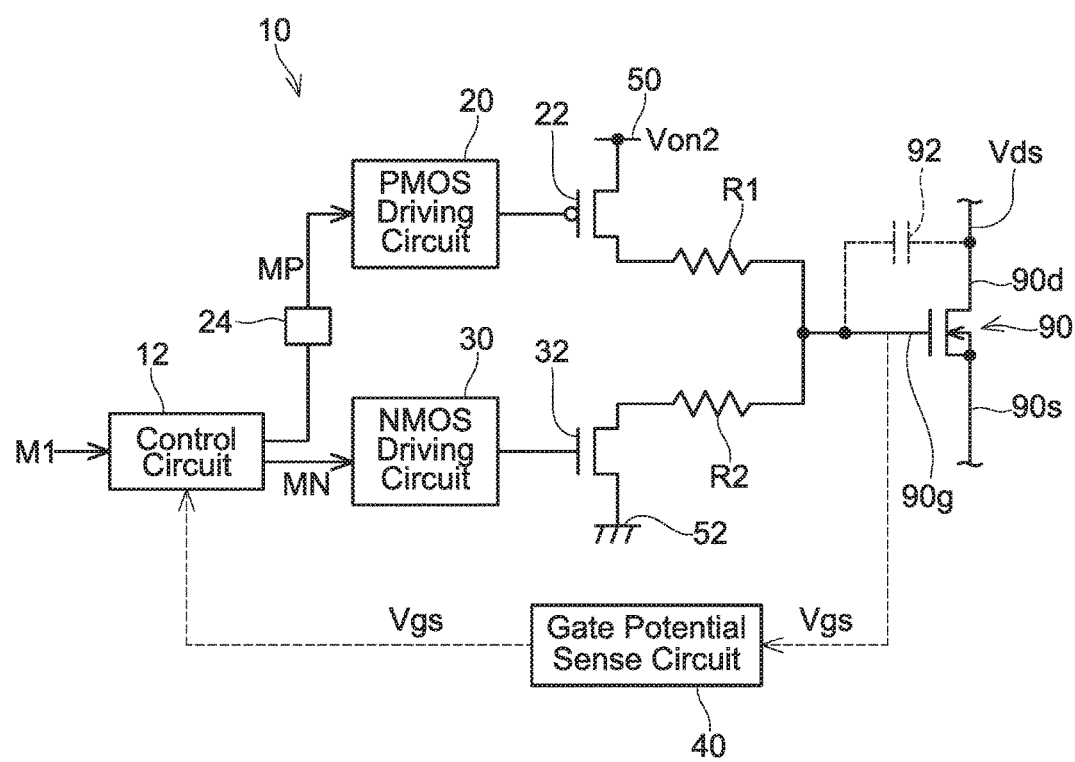
FIG. 1 is a circuit diagram of a gate potential control device.

A gate potential control device 10 of an embodiment shown in FIG. 1 controls a main switching element 90. The main switching element 90 is an NMOS (n-channel type MOSFET (metal-oxide-semiconductor field effect transistor)) including a drain 90$d$, a source 90$s$ and a gate 90$g$. The main switching element 90 is used for switching paths in which high currents flow, for example, in an inverter or a DC-De converter. The gate potential control device 10 controls a gate potential Vgs of the main switching element 90 (that is, potential of the gate 90$g$). The gate potential control device 10 includes a control circuit 12, a PMOS drive circuit 20, a PMOS (p-channel type MOSFET) 22, a gate-on resistor R1, an NMOS drive circuit 30, an NMOS 32, a gate-off resistor R2, and a gate potential sensing circuit 40.

Figure 2:
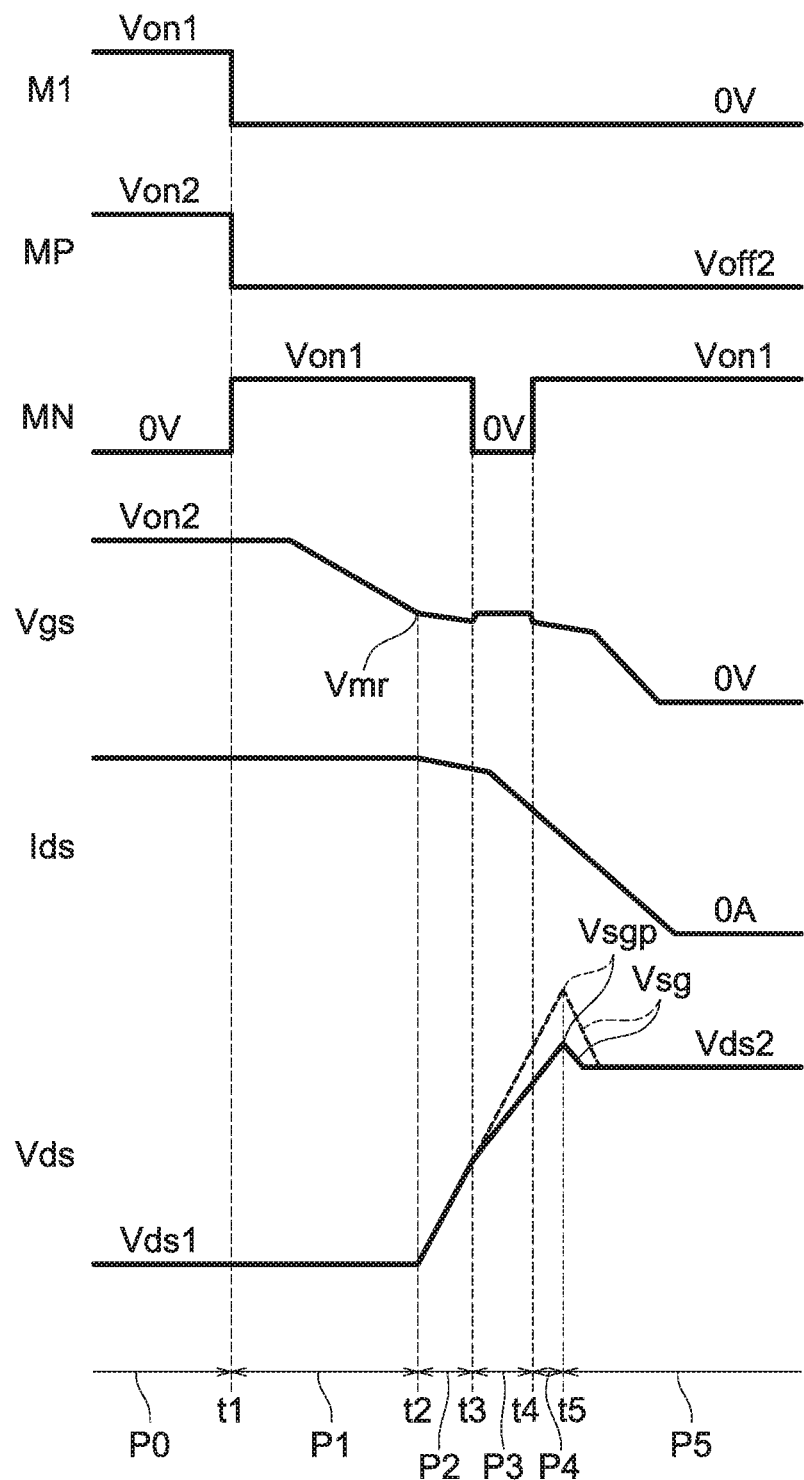
FIG. 2 is a timing chart showing a gate potential control method.

The control circuit 12 includes an IC. The control circuit 12 is connected to the gate potential sensing circuit 40 and the NMOS drive circuit 30. Further, the control circuit 12 is connected also to the PMOS drive circuit 20 through a level shifter 24. The control circuit 12 receives a signal M1 which is transmitted from an outside. As shown in FIG. 2, the signal M1 has a potential which changes between Von1 and 0V. Note that, 0V herein refers to the same potential as that of the source 90s of the main switching element 90. The potential Von1 is higher than 0V. The signal M1 at the potential Von1 corresponds to an instruction to turn on the main switching element 90, and the signal M1 at 0V corresponds to an instruction to turn off the main switching element 90. Further, the control circuit 12 also receives a value which is obtained by sensing with the gate potential sensing circuit 40 and transmitted therefrom (value which is obtained by sensing the gate potential Vgs). The control circuit 12 generates a signal MN and a signal MP according to the received signal M1 and the received gate potential Vgs. The generated signal MN is transmitted from the control circuit 12 to the NMOS drive circuit 30. As shown in FIG. 2, the signal MN has a potential which changes between the potential Von1 and 0V. Further, the generated signal MP is transmitted from the control circuit 12 to the PMOS drive circuit 20 through the level shifter 24. The level shifter 24 is configured to increase a reference potential of the signal MP transmitted from the control circuit 12, and to transmit the signal MP having the increased reference potential to the PMOS drive circuit 20. As shown in FIG. 2, the signal MP after being transmitted through the level shifter 24 (that is, the at the time of being received by the PMOS drive circuit 20) has a potential which changes between Von2 and Voff2. The potential Voff2 is a potential higher than 0V, and the potential Von2 is a potential higher than each of the potential. Von1 and the potential Voff2.

The PMOS drive circuit 20 includes an IC. The PMOS drive circuit 20 is connected to a gate of the PMOS 22. The PMOS drive circuit 20 is configured to control a potential of the gate of the PMOS 22 according to the received signal MP. Due to this, the PMOS drive circuit 20 switches the PMOS 22. The PMOS drive circuit 20 turns on the PMOS 22 when the signal MP is at the potential Von2, and turns off the PMOS 22 when the signal MP is at the potential Voff2.

The PMOS 22 is connected between a high-potential line 50 and the gate 90g of the main switching element 90. The high-potential line 50 is a line to which the potential Von2 is applied. A source of the PMOS 22 is connected to the high-potential line 50. A drain of the PMOS 22 is connected to one end of the gate-on resistor R1. The other end of the gate-on resistor R1 is connected to the gate 90g. Thus, when the PMOS 22 is turned on, a current flows from the high-potential line 50 toward the gate 90g through the PMOS 22 and the gate-on resistor R1. Due to this, the gate 90g can be charged.

The NMOS drive circuit 30 includes an IC. The NMOS drive circuit 30 is connected to a gate of the NMOS 32. The NMOS drive circuit 30 is configured to control a potential of the gate of the NMOS 32 according to the received signal MN. Due to this, the NMOS drive circuit 30 switches the NMOS 32. The NMOS drive circuit 30 turns on the NMOS 32 when the signal MN is at the potential Von1, and turns off the NMOS 32 when the signal MN is at 0V.

The NMOS 32 is connected between the gate 90g of the main switching element 90 and a ground 52 (line to which 0V is applied). A drain of the NMOS 32 is connected to one end of the gate-off resistor R2. The other end of the gate-off resistor R2 is connected to the gate 90g. A source of the NMOS 32 is connected to the ground 52. Thus, when the NMOS 32 is turned on, a current flows from the gate 90g toward the ground 52 through the gate-off resistor R2 and the NMOS 32. Due to this, the gate 90g can be discharged.

The gate potential sensing circuit 40 is configured to sense the gate potential Vgs of the main switching element 90. The gate potential sensing circuit 40 transmits the value which is obtained by sensing the gate potential Vgs to the control circuit 12.

Next, a turn-off operation in which the gate potential control device 10 switches the main switching element 90 from on to off is described. FIG. 2 shows changes in values in the turn-off operation. Note that, a drain-source current Ids in FIG. 2 (hereinafter, abbreviated as drain current Ids) is a current which flows from the drain 90d to the source 90s. Further, a drain-source voltage Vds (hereinafter, abbreviated as drain voltage Vds) in FIG. 2 is a voltage between the drain 90d and the source 90s. In the timing chart of the drain voltage Vds, a solid line represents values of the drain voltage Vds with respect to the gate potential control device 10 of this embodiment, and a broken line represents values of a drain voltage with respect to a gate potential control device of a comparative example. Further, in periods P0, P1, P2, P3, P4, and P5 shown in FIG. 2, the gate potential sensing circuit 40 repetitively executes processes of sensing the gate potential Vgs and transmitting the value which is obtained by the sensing to the control circuit 12.

A timing t1 in FIG. 2 is a starting timing of the turn-off operation. In the period P0 prior to the timing t1, the signal M1 is maintained at the potential Von1 (potential corresponding to the instruction to turn on the main switching element 90). While the signal M1 is maintained at the potential Von1, the control circuit 12 maintains the signal MP at the potential Von2, and the signal MN at 0V. Thus, in the period P0, the PMOS drive circuit 20 keeps the PMOS 22 turned on, and the NMOS drive circuit 30 keeps the NMOS 32 turned off. As a result, in the period P0, the gate 90g of the main switching element 90 is connected to the high-potential line 50 through the PMOS 22 and the gate-on resistor R1. Accordingly, in the period P0 the potential Von2 of the high-potential line 50 is applied to the gate 90g of the main switching element 90. The potential Von2 is higher than a gate threshold value of the main switching element 90. Thus, in the period P0, the main switching element 90 is turned on, and the drain current Ids is high, and the drain voltage Vds is maintained at an on-voltage Vds1. Note that, the on-voltage Vds1 is a voltage between the drain 90d and the source 90a under a state in which the main switching element 90 is turned on, which depends mainly on characteristics of the main switching element 90.

At the timing t1, the potential of the signal M1 changes from Von1 to 0V in response, the control circuit 12 reduces the potential of the signal MP from Von2 to Voff2, and increases the potential of the signal MN from 0V to Von1. In response, the PMOS drive circuit 20 turns off the PMOS 22, and the NMOS drive circuit 30 turns on the NMOS 32. When the PMOS 22 is turned off, the gate 90g is disconnected from the high-potential line 50. Further, when the NMOS 32 is turned on, the gate 90g is connected to the ground 52 through the gate-off resistor R2 and the NMOS 32. Due to this, the current flows from the gate 90g toward the ground 52, and the gate 90g is discharged. For this reason, in the period. P1 immediately after the timing t1, the gate potential Vgs decreases.

At a timing t2, the gate potential Vgs has decreased to a potential Vmr (what is called Miller potential). Immediately thereafter, in the period P2, the drain current Ids starts decreasing, and the drain voltage Vds starts increasing. Further, when the drain current Ids starts decreasing in the period P2, a decreasing rate of the gate potential Vgs becomes low by a Miller effect. The control circuit 12 has been monitoring the gate potential Vgs since the start of the turn-off operation. More specifically, since the start of the turn-off operation, the control circuit 12 has been monitoring whether or not the decreasing rate of the gate potential Vgs is a certain value or less. In the period P2, the decreasing rate of the gate potential Vgs decreases to a certain value or less. Thus, immediately after the timing t2, the control circuit 12 senses that the decreasing rate of the gate potential Vgs has decreased to the certain value or less. Then, at a timing t3 at which a predetermined time has passed from the timing 12, the control circuit 12 reduces the potential of the signal MN from Von1 to 0V. A time from the timing t2 to the timing 13 is a time which is preset in the control circuit 12. The potential of the signal MN is reduced from Von1 to 0V, and hence the NMOS 32 is turned off at the timing t3. In other words, in the period P3 immediately after the timing t3, both of the PMOS 22 and the NMOS 32 are turned off. Thus, the gate 90g of the main switching element 90 enters a floating state. When the potential of the gate 90g floats, the gate potential Vgs is slightly increased by capacitive coupling through a parasitic capacitance 92 which exists between the gate 90g and the drain 90d. Thus, the gate potential Vgs in the period P3 becomes slightly higher than that in the period P2 immediately prior thereto. Therefore, in the period P3 an impedance of the main switching element 90 decreases. As a result, an increasing rate of the drain voltage Vds in the period P3 becomes lower than that in the period P2. In other words, the drain voltage Vds continues to increase from the period P2 to the period P3, but the increasing rate of the drain voltage Vds in the period P3 is lower than that in the period P2.

At a timing t4 after a predetermined time lapse from the timing t3, the control circuit 12 restores the potential of the signal MN from 0V to Von1. A time from the timing 13 to the timing 14 is a time which is preset in the control circuit 12. The time of from the timing t3 to the timing t4 is preset such that the timing t4 is a timing prior to a timing t5 at which the drain voltage Vds reaches its peak value Vsgp by influence of a surge voltage Vsg. When the potential of the signal MN increases to Von1 at the timing t4, the NMOS 32 is turned on again. Then, the gate 90g is connected to the ground 52, and the gate potential Vgs is slightly reduced. The increasing rate of the drain voltage Vds in the period P4 immediately after the timing t4 is not significantly changed from that in the period P3.

At the end of the period P4, the surge voltage Vsg is generated. By the influence of the surge voltage Vsg, the drain voltage Vds reaches the peak value Vsgp at the timing t5. In the period P5 after the peak value Vsgp is reached, the drain voltage Vds decreases to a voltage Vds2, and is stabilized at the voltage Vds2. The voltage Vds2 is a voltage which is lower than the peak value Vsgp and higher than the on-voltage Vds1. Further, in the period P5, the gate potential Vgs decreases to 0V, and the drain current Ids decreases to substantially 0A. Due to this, the turn-off operation of the main switching element 90 is completed.

As described above, the broken line of the drain voltage Vds in the timing chart of FIG. 2 represents values of the drain voltage Vds with respect to the gate potential control device of the comparative example. In the gate potential control device of the comparative example, the NMOS 32 remains turned on throughout the turn-off operation. Thus, the gate potential Vgs does not increase in the period P3, and hence the impedance of the main switching element 90 does not decrease. As a result, in the period P3, the increasing rate of the drain voltage Vds does not become low, and hence the drain voltage Vds continues to increase at fast rate until the surge voltage Vsg is generated. For this reason, the peak value Vsgp of the surge voltage Vsg becomes higher than that in the embodiment.

As described hereinabove, the gate potential control device 10 of the embodiment is capable of reducing the peak value Vsgp of the surge voltage Vsg more than the gate potential control device of the comparative example does. Further, loss which is caused when the main switching element 90 is turned off (turn-off loss) can be reduced by reducing the surge voltage Vsg.

Further, in the gate potential control device 10 of the embodiment, the NMOS 32 is turned off at the timing t3 after the predetermined time lapse from the timing t2 of the rise-up of the drain voltage Vds from the on-voltage Vds1 in the turn-off operation. Thus, in the period P2 from the timing t2 to the timing t3, the increasing rate of the drain voltage Vds is high. The increasing rate of the drain voltage Vds in the period P2 does not influence a magnitude of the surge voltage Vsg. Thus, even when the increasing rate of the drain voltage Vds in the period P2 is high, the surge voltage Vsg can be reduced. Further, in the gate potential control device 10 of the embodiment, the increasing rate of the drain voltage Vds is increased in the period P2 immediately after the rise-up of the drain voltage Vds, and then the increasing rate of the drain voltage Vds is reduced in the period P3 after P2 and prior to the generation of the surge voltage Vsg. Due to this, the main switching element 90 can be switched at relatively fast speed while the surge voltage Vsg is reduced.

Further, the gate potential control device 10 of the above-described embodiment adjusts the increasing rate of the drain voltage Vds not by changing a resistance of the gate-off resistor R2 but by reducing the impedance of the main switching element 90 through bringing the gate 90g into the electrically floating state. A plurality of gate-off resistors for adjusting the increasing rate of the drain voltage Vds need not be provided. Thus, the gate potential control device 10 can be downsized. In addition, when the plurality of gate-off resistors for adjusting the increasing rate of the drain voltage Vds need not be provided, influence of errors in resistance between the gate-off resistors is negligible, and hence the turn-off operation can be stably performed. Further, by the method of bringing the gate 90g into the electrically floating state as in this embodiment, the increasing rate of the drain voltage Vds can be reduced only by turning off the single NMOS 32. A switching speed of the NMOS 32 is high, and hence the period P3 in which the increasing rate of the drain voltage Vds is low can be shortened. When the period P3 is shortened, the period P2 can be increased, and hence the switching speed of the main switching element 90 can be further increased. In other words, the gate potential control device 10 of this embodiment is capable of switching the main switching element at speed higher than that in a gate potential control device configured to control the increasing rate of the drain voltage by changing the resistances of the gate-off resistors.

Further, it is also conceivable to turn on the PMOS 22 while turning off the NMOS 32 in the period P3. However, carriers of the PMOS 22 are holes, and hence a switching speed of the MOS 22 is low. Thus, the PMOS 22 is difficult to turn on within the extremely short period P3. In addition, when the PMOS 22 is turned on, there is a risk that the gate potential Vgs unnecessarily increases in the period P3. In this way, when the PMOS 22 is turned on, the gate potential Vgs is difficult to accurately control in the period P3. Meanwhile, in the gate potential control device 10 of this embodiment, in the period P3, in order that the gate potential Vgs can be accurately controlled, the PMOS 22 is not turned on, and the gate 90g is brought into the floating state. Due to this, the turn-off operation can be stably performed.

In the above-described embodiment, the description is given with regard to the reduction of the peak value Vsgp of the surge voltage Vsg. However, when settings are made such that the peak values Vsgp to be obtained in both of the embodiment and the comparative example are equivalent to each other, the switching speed in the embodiment becomes higher than that in the comparative example. Also in this case, switching loss can be reduced with the configuration of the embodiment.

Figure 3:
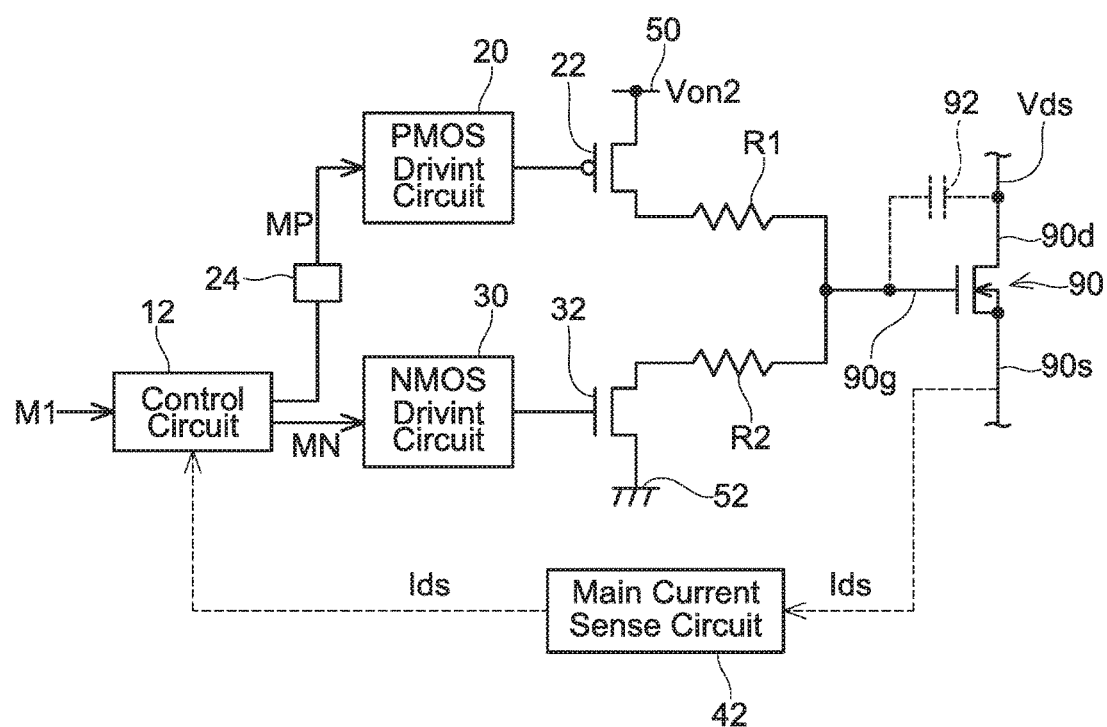
FIG. 3 is a circuit diagram of a gate potential control device of a modification.

In the above-described embodiment, the timing t3 at which the NMOS 32 is turned off is determined based on the decreasing rate of the gate potential Vgs. However, as shown in FIG. 3, a drain current sensing circuit 42 configured to sense the drain current Ids may be provided such that the timing t3 at which the NMOS 32 is turned off is determined based on a decreasing rate of the drain current Ids. As shown in FIG. 2, the drain current Ids starts decreasing substantially simultaneously with the timing t2 of the rise-up of the drain voltage Vds. Thus, the timing t3 at which the NMOS 32 is turned off may be determined based on a timing at which the decreasing rate of the drain current Ids exceeds a certain value. As long as the timing t3 at which the NMOS 32 is turned off can be determined in accordance with the timing t2 of the rise-up of the drain voltage Vds, there is no particular limitation as to based on which value the timing t3 is determined.

Further, in the above-described embodiment, the NMOS 32 is turned on again at the timing t4 prior to the occurrence of the peak value Vsgp of the surge voltage Vsg. However, the NMOS 32 may be turned on again at a timing subsequent to the occurrence of the peak value Vsgp (for example, tuning at which the drain voltage Vds is stabilized at the voltage Vds2).

Still further, in the above-described embodiment, the main switching element 90 is an NMOS. However, the main switching element 90 may be an IGBT (insulated gate bipolar transistor).

Now, relationships between the components in the above-described embodiment and components in claims are described. The PMOS 22 in the embodiment is an example of the "turn-on switching element" in claims. The NMOS 32 in the embodiment is an example of the "turn-off switching element" in claims. The drain current Ids is an example of the "main current" in claims. The drain voltage Vds in the embodiment is an example of the "main voltage" in claims. The voltage Vds2 in the embodiment is an example of the "off-voltage" in claims. The period P3 and the period P4 in the embodiment are an example of the "specific period in the turn-off operation, the specific period being from a timing after a predetermined time lapse from a timing of rise-up of the main voltage from the on-voltage to a timing at which the main voltage reaches the peak value" in claims. The period P3 in the embodiment is an example of the "period which is at least a part of a specific period in the turn-off operation, the specific period being from a timing after a predetermined time lapse from a timing of rise-up of the main voltage from the on-voltage to a timing at which the main voltage reaches the peak value" in claims (that is, example of "the period in which both of the turn-on switching element and the turn-off switching element are kept turned off" in claims).

Some of the technical elements disclosed herein will hereinafter be enumerated. It should be noted that each of the technical elements below is independently useful.

In a gate potential control device disclosed herein as an example may further comprise a sensor configured to sense the potential of the gate. A starting timing of the period in which both of the turn-on switching element and the turn-off switching element are kept turned off may be controlled based on a timing at which a decreasing rate of the gate potential becomes low in the turn-off operation. Substantially simultaneously with the timing of the rise-up of the main voltage of the main switching element, the decreasing rate of the potential of the gate becomes low by the Miller effect. Thus, the period can be started at the timing after the predetermined time lapse from the timing of the rise-up of the main voltage of the main switching element by controlling the starting timing of the period based on the timing at which the decreasing rate of the potential of the gate becomes low.

In a gate potential control device disclosed herein as an example may further comprise a sensor configured to sense a main current of the main switching element. A starting timing of the period in which both of the turn-on switching element and the turn-off switching element are kept turned off may be controlled based on a timing at which the main current starts decreasing in the turn-off operation. Substantially simultaneously with the timing of the rise-up of the main voltage of the main switching element, the main current of the main switching element starts decreasing. Thus, also when the starting timing of the period is controlled based on the timing at which the main current starts decreasing, the period can be started at the timing at which the predetermined time has passed from the timing of the rise-up of the main voltage of the main switching element.

In the gate potential control device of yet another example disclosed herein, an ending timing of the period in which both of the turn-on switching element and the rum-off switching element are maintained off is prior to a timing at which the main voltage reaches the peak value.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A gate potential control device configured to control potential of a gate of a main switching element, the gate potential control device comprising:
   a turn-on switching element including main terminals one of which is connected to a gate-on potential and the other of which is connected to the gate; and
   a turn-off switching element including main terminals one of which is connected to the gate and the other of which is connected to a gate-off potential which is lower than the gate-on potential, wherein
in a turn-off operation in which the main switching element is turned off by discharging the gate through the turn-off switching element, a main voltage between main terminals of the main switching element increases from an on-voltage to a peak value of a surge voltage and then decreases to an off-voltage which is lower than the peak value and higher than the on-voltage, the gate potential control device is configured to keep both of the turn-on switching element and the turn-off switching element turned off in a period which is at least a part of a specific period in the turn-off operation, the specific period being from a timing after a predetermined time lapse from a timing of rise-up of the main voltage from the on-voltage to a timing at which the main voltage reaches the peak value.

2. The gate potential control device of claim 1, further comprising a sensor configured to sense the potential of the gate, wherein a starting timing of the period in which both of the turn-on switching element and the turn-off switching element are kept turned off is controlled based on a timing at which a decreasing rate of the potential of the gate becomes low in the turn-off operation.

3. The gate potential control device of claim 1, further comprising a sensor configured to sense a main current of the main switching element, wherein a starting timing of the period in which both of the turn-on switching element and the turn-off switching element are kept turned off is controlled based on a timing at which the main current starts decreasing in the turn-off operation.

4. The gate potential control device of claim 1, wherein an ending timing of the period in which both of the turn-on switching element and the turn-off switching element are kept turned off is prior to a timing at which the main voltage reaches the peak value.

5. The gate potential control device of claim 1, wherein the gate is separated from the gate-on potential and the gate-off potential in the period in which the gate potential control device keeps both of the turn-on switching element and the turn-off switching element turned off.

\* \* \* \* \*